(12) United States Patent  
Zhang

(10) Patent No.: US 11,705,588 B2  
(45) Date of Patent: Jul. 18, 2023

(54) SHUTDOWN METHOD AND TERMINAL

(71) Applicant: BEIJING XIAOMI MOBILE SOFTWARE CO., LTD., Beijing (CN)

(72) Inventor: Jinlong Zhang, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 348 days.

(21) Appl. No.: 17/033,888

(22) Filed: Sep. 27, 2020

(65) Prior Publication Data

US 2021/0320339 A1    Oct. 14, 2021

(30) Foreign Application Priority Data

Apr. 10, 2020   (CN) .......................... 202010278846.7

(51) Int. Cl.
    H02J 7/00       (2006.01)
    H01M 10/44      (2006.01)
    G01R 27/02      (2006.01)
    H01M 10/48      (2006.01)

(52) U.S. Cl.
    CPC .......... *H01M 10/443* (2013.01); *G01R 27/02* (2013.01); *H01M 10/486* (2013.01)

(58) Field of Classification Search
    None
    See application file for complete search history.

(56) References Cited

U.S. PATENT DOCUMENTS

2005/0206348 A1*   9/2005   Tsuchiya ............. H01M 10/488  
                                                    320/156  
2015/0244184 A1*   8/2015   Kerfoot, Jr ......... H01M 10/425  
                                                    320/106

\* cited by examiner

*Primary Examiner* — Arun C Williams  
(74) *Attorney, Agent, or Firm* — Syncoda LLC; Feng Ma

(57) ABSTRACT

A shutdown method applicable to a terminal having a rechargeable battery, the method includes: determining a first impedance and a second impedance of the rechargeable battery, wherein the first impedance is an impedance determined based on a current temperature of the rechargeable battery, and the second impedance is an impedance determined based on a current number of charge times of the rechargeable battery; determining a target impedance as a larger impedance value from the first impedance and the second impedance; determining a shutdown voltage of the terminal based on a preset open circuit voltage of the rechargeable battery, the target impedance and a current operating current of a charging circuit; and controlling the terminal to shut down, when an operating voltage of the rechargeable battery is decreased to the shutdown voltage.

20 Claims, 3 Drawing Sheets determining a first impedance and a second impedance of the rechargeable battery, wherein the first impedance is an impedance determined based on a current temperature of the rechargeable battery, and the second impedance is an impedance determined based on a current number of charge times of the rechargeable battery; — 101 determining a target impedance as a larger impedance value from the first impedance and the second impedance — 102 determining a shutdown voltage of the terminal based on a preset open circuit voltage of the rechargeable battery, the target impedance and a current operating current of the rechargeable battery — 103 controlling the terminal to shut down, when an operating voltage of the rechargeable battery is decreased to the shutdown voltage — 104

SHUTDOWN METHOD AND TERMINAL

CROSS-REFERENCE TO RELATED APPLICATION

This application claims priority to Chinese patent application No. 202010278846.7 filed on Apr. 10, 2020, the disclosure of which is hereby incorporated by reference in its entirety.

BACKGROUND

Some terminals, such as mobile phones and tablets, are provided with rechargeable batteries as power supplies. Currently, a shutdown voltage of a terminal is preset, and the terminal is shutdown when an operating voltage of a rechargeable battery is decreased to the preset shutdown voltage.

SUMMARY

The present disclosure relates generally to a field of computer communication technologies, and more specifically to a shutdown method and a terminal.

Various embodiments of the present disclosure provide a shutdown method applicable for a terminal that is provided with a rechargeable battery, and the method includes:

determining a first impedance and a second impedance of the rechargeable battery, in which the first impedance is an impedance determined based on a current temperature of the rechargeable battery, and the second impedance is an impedance determined based on a current number of charge times of the rechargeable battery;

determining a target impedance as a larger impedance value from the first impedance and the second impedance;

determining a shutdown voltage of the terminal based on a preset open circuit voltage of the rechargeable battery, the target impedance and a current operating current of a charging circuit; and controlling the terminal to shut down, when an operating voltage of the rechargeable battery is decreased to the shutdown voltage.

Some embodiments of the present disclosure provide a terminal, and the terminal includes a rechargeable battery, provided in the terminal; a battery manager, configured to monitor parameters of the rechargeable battery, wherein the parameters of the rechargeable battery includes a temperature of the rechargeable battery, a number of charge times of the rechargeable battery, and an operating current of the rechargeable battery; and a control component, communicated with the battery manager.

In which, the control component is configured to:

determine a first impedance and a second impedance of the rechargeable battery, wherein the first impedance is an impedance determined based on a current temperature of the rechargeable battery, and the second impedance is an impedance determined based on a current number of charge times of the rechargeable battery;

determine a target impedance as a larger impedance value from the first impedance and the second impedance;

determine a shutdown voltage of the terminal based on a preset open circuit voltage of the rechargeable battery, the target impedance and a current operating current of the rechargeable battery; and control the terminal to shut down, when an operating voltage of the rechargeable battery is decreased to the shutdown voltage.

It should be understood that the above general description and the following detailed description are only exemplary and explanatory, and do not limit the present disclosure.

BRIEF DESCRIPTION OF THE DRAWINGS

The accompanying drawings, which are incorporated in and constitute a part of this disclosure, illustrate embodiments consistent with the present disclosure and, together with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of apparatuses and methods consistent with aspects related to the present disclosure as recited in the appended claims.

The terminology used in the present disclosure is for the purpose of describing specific embodiments only, and is not intended to limit the present disclosure. The singular forms "a," "said" and "the" used in the present disclosure and the appended claims are intended to include the majority forms, unless specified otherwise. It should be understood that the term "and/or" as used herein refers to and encompasses any or all possible combinations of one or more associated listed items.

It should be understood that although the terms "first," "second," and "third" may be used to describe various information in this disclosure, the information should not be limited to these terms. These terms are only used to distinguish the same type of information from each other. For example, without departing from the scope of the present disclosure, the first information may also be referred to as the second information, and similarly, the second information may also be referred to as the first information. Depending on the context, the word "if" as used herein may be interpreted as "when" or "while" or "in response to determining".

Figure 1:
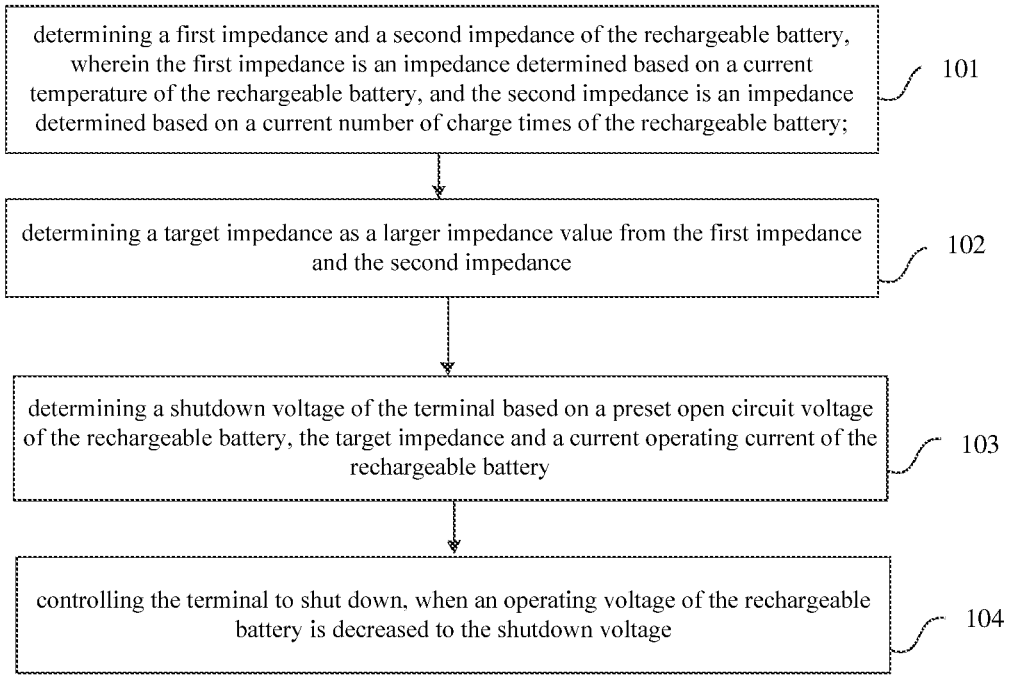
FIG. 1 is a flowchart of a shutdown method according to some embodiments.

FIG. 1 is a flowchart of a shutdown method according to some embodiments. The method shown in FIG. 1 is applicable to a terminal, and the terminal is provided with a rechargeable battery. The method includes the following steps.

At step 101, a first impedance and a second impedance of the rechargeable battery are determined, the first impedance is an impedance determined based on a current temperature of the rechargeable battery, and the second impedance is an impedance determined based on a current number of charge times of the rechargeable battery.

In some embodiments of the present disclosure, the terminal has a built-in rechargeable battery, and uses the rechargeable battery for power supply. There are many types of terminals, such as mobile phones, tablets, and notebooks. There are many types of rechargeable batteries, such as lithium-ion batteries, lead-acid batteries, and graphene batteries.

The impedance of the rechargeable battery refers to the resistance that the current receives when passing through the interior of the rechargeable battery. Due to the presence of the impedance, the operating voltage of the rechargeable battery is less than the open circuit voltage.

For some rechargeable batteries, such as lithium-ion batteries, in a low temperature environment, the temperature of the rechargeable battery is low, resulting in an increase in the impedance of the battery and a decrease in discharge performance. The temperature of the rechargeable battery affects the discharge performance of the rechargeable battery. Based on this, in some embodiments of the present disclosure, the current temperature of the rechargeable battery is obtained, and the first impedance of the rechargeable battery is determined based on the current temperature of the rechargeable battery.

Figure 2:
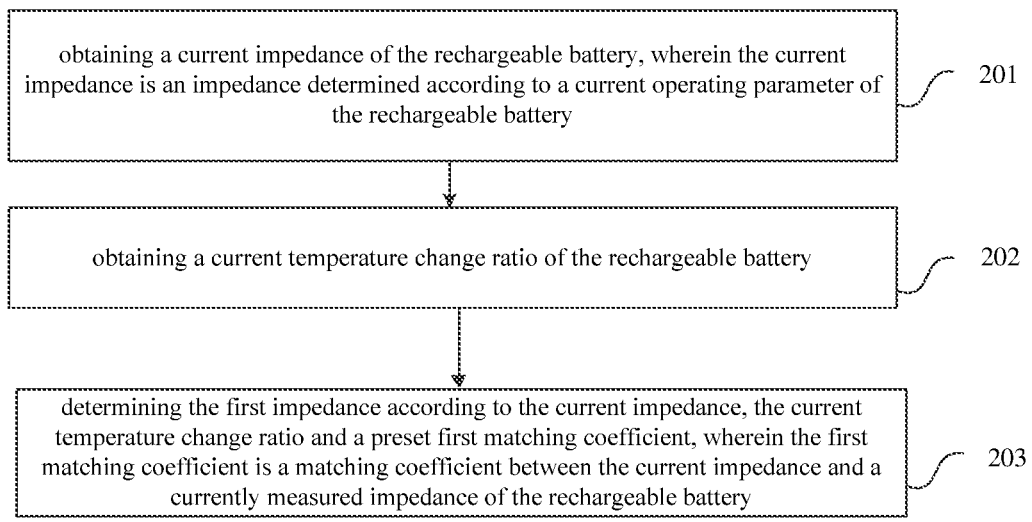
FIG. 2 is a flowchart of a method for determining a first impedance of a rechargeable battery according to some embodiments.

In some embodiments, FIG. 2 is a flowchart of a method for determining a first impedance of a rechargeable battery according to some embodiments. The method as illustrated in FIG. 2 includes the following steps.

At step 201, a current impedance of the rechargeable battery is obtained, the current impedance is an impedance determined according to a current operating parameter of the rechargeable battery.

The operating parameter of the rechargeable battery at a current time point is the current operating parameter of the rechargeable battery, and the impedance determined according to the current operating parameter is the current impedance.

The current operating parameter may include: a current operating voltage, a current operating current and a current open circuit voltage. The terminal may subtract the current open circuit voltage from the current operating voltage to obtain a first voltage difference, and divide the first voltage difference by the current operating current to obtain the current impedance.

SOC (State of Charge, e.g., remaining power) refers to the ratio (usually in percentage) of residual capacity of the battery after a period of use or left unused over a long period of time to the capacity of the fully charged battery. A value range of the SOC is 0 to 1. When SOC=0, it means that the battery is completely discharged. When SOC=1, it means the battery is fully charged. For the rechargeable battery, when the battery structure is fixed, the battery's chemical characteristics, that is, the battery SOC-OCV curve is fixed, and the SOC-OCV curve is generated. The state of charge is used as the abscissa and the open circuit voltage is used as the ordinate in the curve.

A measuring device is provided in the terminal for measuring the current residual capacity of the rechargeable battery, that is, the current SOC. After obtaining the current SOC, the terminal determines the current open circuit voltage corresponding to the current SOC on the SOC-OCV curve.

There are also other measuring devices in the terminal for measuring other operating parameters of the rechargeable battery.

At step 202, a current temperature change ratio of the rechargeable battery is obtained.

The current temperature change ratio of the rechargeable battery may be: a change ratio of the current temperature of the rechargeable battery to a historical temperature, or may be a change ratio of the current temperature of the rechargeable battery to a preset temperature.

For example, the terminal may obtain the current temperature of the rechargeable battery, subtract the preset standard temperature from the current temperature to obtain a temperature difference, and divide the temperature difference by the standard temperature to obtain the current temperature change ratio. The standard temperature $T_0$ may be set as required, for example, 25° C.

At step 203, the first impedance is determined according to the current impedance, the current temperature change ratio and a preset first matching coefficient, the first matching coefficient is a matching coefficient between the current impedance and a currently measured impedance of the rechargeable battery.

In some embodiments, the first impedance may be obtained based on a product of the current impedance, the current temperature change ratio, and the first matching coefficient. The first impedance may be calculated by the following formula:

$$R_T = a \times \frac{T - T_0}{T_0} \times \frac{V - OCV}{I} \qquad (1)$$

$R_T$ is the first impedance; T is the current temperature of the rechargeable battery; $T_0$ is the standard temperature; V is the current operating voltage of the rechargeable battery; I is the current operating current of the rechargeable battery; OCV is the current open circuit voltage of the rechargeable battery; a is the first matching coefficient.

In some embodiments, the first matching coefficient is determined as follows.

Firstly, the initial impedance and the initially measured impedance of the rechargeable battery are obtained. The initial impedance is the impedance determined according to the initial operating parameter of the rechargeable battery.

Before the rechargeable battery leaves a factory, a performance test is performed on the rechargeable battery. The operating parameter of the rechargeable battery during the test is the initial operating parameter, and the impedance determined according to the initial operating parameter is the initial impedance.

The initial operating parameter may include: the initial operating voltage, the initial operating current, and the initial open circuit voltage. The terminal may subtract the initial open circuit voltage from the initial operating voltage to obtain a second voltage difference, and divide the second voltage difference by the initial operating current to obtain the initial impedance.

Before the rechargeable battery leaves the factory, during the performance test of the rechargeable battery, a measuring device is used to measure the impedance of the rechargeable battery. The impedance measured during the test is the initially measured impedance.

Secondly, the initial temperature change ratio of the rechargeable battery is obtained.

In the case that the current temperature change ratio of the rechargeable battery is the change ratio of the current temperature of the rechargeable battery to the preset temperature, the initial temperature change ratio of the rechargeable battery is a change ratio of the temperature of the rechargeable battery during the test before leaving the factory (hereinafter referred to as the initial temperature) to the preset temperature.

For example, the terminal may obtain the initial temperature of the rechargeable battery, subtract the preset standard temperature from the initial temperature to obtain an initial temperature difference, and divide the initial temperature difference by the standard temperature to obtain an initial temperature change ratio.

Finally, the first matching coefficient is determined according to the initially measured impedance, the initial impedance and the initial temperature change ratio.

In some embodiments, the initially measured impedance may be divided by the initial impedance to obtain a first ratio, and the first ratio may be divided by the initial temperature change ratio to obtain a first matching coefficient.

The first matching coefficient may be calculated by the following formula:

$$R_T'' = R_T' = a \times \frac{T' - T_0}{T_0} \times \frac{V' - OCV'}{I'} \quad (2)$$

$$a = R_T'' \times \frac{T_0}{T' - T_0} \times \frac{I'}{V' - OCV'} \quad (3)$$

a is the first matching coefficient; $R_T''$ is the initially measured impedance of the rechargeable battery; $R_T'$ is the calculated impedance; T' is the initial temperature of the rechargeable battery; $T_0$ is the standard temperature; V' is the initial operating voltage of the rechargeable battery; I' is the initial operating current of the rechargeable battery; and OCV' is the initial open circuit voltage of the rechargeable battery.

While measuring T', V', and I', the SOC' of the rechargeable battery is measured to determine the OCV' corresponding to SOC' on the SOC-OCV curve of the rechargeable battery. The SOC is the initial state of charge of the rechargeable battery.

By equalizing the initially measured impedance to the calculated impedance, the first matching coefficient a is obtained.

In terms of implementation, during the test, T', V', and I' and OCV' may be obtained at each time point. Through the above formula (2) and formula (3), first matching coefficient a at each time point are obtained accordingly. Statistics are performed on the first matching coefficient a at each time point to obtain a final first matching coefficient a. For example, an average value of the first matching coefficient a at each time point may be calculated to obtain the final first matching coefficient a.

The number of charge times of the rechargeable battery affects the magnitude of the impedance of the rechargeable battery. Generally, the larger the number of charge times of the rechargeable battery, the greater the impedance of the rechargeable battery. Based on this, in some embodiments of the present disclosure, the current number of charge times of the rechargeable battery is obtained, and the second impedance of the rechargeable battery is determined based on the current number of charge times of the rechargeable battery.

Figure 3:
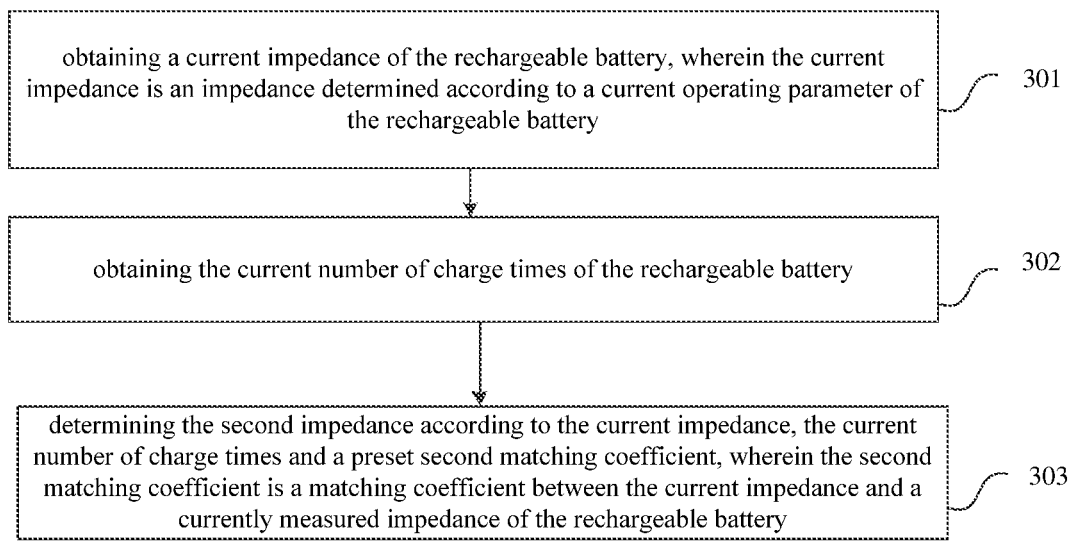
FIG. 3 is a flowchart of a method for determining a second impedance of a rechargeable battery according to some embodiments.

In some embodiments, FIG. 3 is a flowchart of a method for determining a second impedance of a rechargeable battery according to some embodiments. The method as illustrated in FIG. 3 includes the followings.

At step 301, a current impedance of the rechargeable battery is obtained, the current impedance is an impedance determined according to a current operating parameter of the rechargeable battery.

At step 302, the current number of charge times of the rechargeable battery is obtained.

The terminal is also provided with a statistics module, which is configured to accumulate the number of charge times of the rechargeable battery. The current number of charge times is the cumulative charge times of the rechargeable battery at the current time point.

At step 303, the second impedance is determined according to the current impedance, the current number of charge times and a preset second matching coefficient, the second matching coefficient is a matching coefficient between the current impedance and a currently measured impedance of the rechargeable battery.

In some embodiments, the second impedance is obtained based on a product of the current impedance, the current number of charge times and the second matching coefficient.

The second impedance is obtained by the following formula:

$$R_{cycle} = b \times \text{cycle} \times \frac{V - OCV}{I} \quad (4)$$

$R_{cycle}$ is the second impedance; cycle is the current number of charge times of the rechargeable battery; V is the current operating voltage of the rechargeable battery; I is the current operating current of the rechargeable battery; OCV is the current open circuit voltage of the rechargeable battery; b is the second matching coefficient.

In some embodiments, the second matching coefficient is determined as follows.

First, the initial impedance and the initially measured impedance of the rechargeable battery are obtained. The initial impedance is the impedance determined according to the initial operating parameter of the rechargeable battery.

Before the rechargeable battery leaves the factory, the performance test is performed on the rechargeable battery. The operating parameter of the rechargeable battery during the test is the initial operating parameter, and the impedance determined according to the initial operating parameter is the initial impedance. The initial operating parameter may include: the initial operating voltage, the initial operating current, and the initial open circuit voltage.

Before the rechargeable battery leaves the factory, during the performance test of the rechargeable battery, the measurement device is used to measure the impedance of the rechargeable battery, and the measured impedance is the initially measured impedance.

Second, the initial number of charge times of the rechargeable battery is obtained.

The initial number of charge times of the rechargeable battery is the cumulative number of charge times of the rechargeable battery during the performance test before leaving the factory.

Third, the second matching coefficient is determined according to the initially measured impedance, the initial impedance and the initial number of charge times.

For example, the initially measured impedance is divided by the initial impedance to obtain a second ratio, and the second ratio is divided by the initial number of charge times to obtain the second matching coefficient.

The second matching coefficient is obtained by the following formula:

$$R''_{cycle} = R'_{cycle} = b \times \text{cycle}' \times \frac{V' - OCV'}{I'} \quad (5)$$

$$b = R''_{cycle} \times \frac{1}{\text{cycle}'} \times \frac{I'}{V' - OCV'} \quad (6)$$

b is the second matching coefficient; $R_{cycle}''$ is the initially measured impedance of the rechargeable battery; $R_{cycle}'$ is the calculated impedance; cycle' is the initial number of charge times of the rechargeable battery; V' is the initial operating voltage of the rechargeable battery; I' is the initial operating current of the rechargeable battery; OCV' is the initial open circuit voltage of the rechargeable battery.

The V', I', and OCV' in the formula (2) and formula (3) are the same as the V', I', and OCV' in the formula (5) and formula (6).

By equalizing the initially measured impedance to the calculated impedance, the second matching coefficient b is obtained.

In terms of implementation, during the test, cycle', V', I', and OCV' may be obtained at each time point. Through the above formula (5) and formula (6), the second matching coefficient b at each time point is obtained. Statistics are performed on the second matching coefficient b at each time point to obtain a final second matching coefficient b. For example, an average value of the second matching coefficient b at each time point may be calculated to obtain the final second matching coefficient b.

In some embodiments, the terminal may obtain the current remaining power of the rechargeable battery, and the current remaining power is the remaining power of the rechargeable battery at the current time point.

After obtaining the current remaining power of the rechargeable battery, the terminal determines whether the current remaining power is deceased to a preset power threshold, and if the current remaining power is deceased to the preset power threshold, step 101 is executed to determine the first and second impedances of the rechargeable battery. The magnitude of the power threshold may be set according to needs and experience, for example, 15% or 10%.

For example, the power threshold is 15%, and when the current remaining power of the rechargeable battery is deceased to 15%, step 101 is executed.

At step 102, a target impedance as a larger impedance value is determined from the first impedance and the second impedance.

For example, if the first impedance is greater than the second impedance, the first impedance is determined as the target impedance, and if the first impedance is less than the second impedance, the second impedance is determined as the target impedance.

At step 103, a shutdown voltage of the terminal is determined based on a preset open circuit voltage of the rechargeable battery, the target impedance and a current operating current of a charging circuit.

The preset open circuit voltage is the open circuit voltage when the remaining power of the rechargeable battery is decreased to a preset power, and the value of the preset power is small, preferably 0%.

In some embodiments, the terminal may obtain a target voltage based on a product of the target impedance and the current operating current, and subtract the target voltage from the preset open circuit voltage to obtain the shutdown voltage.

Assuming that the target impedance is R, the current operating current is I, the preset open circuit voltage is $OCV_0$, and the shutdown voltage is TV, then $TV = OCV_0 - I \times R$.

In some embodiments, the shutdown voltage may be determined in the following manner:

$$TV = \min\{TV_1, TV_2\} = \min\{OCV_0 - I \times R_{T0}, OCV_0 - I \times R_{cycle0}\}$$

$R_{T0}$ is the first impedance of the rechargeable battery when the remaining power of the rechargeable battery is decreased to the preset power; $R_{cycle0}$ is the second impedance of the rechargeable battery when the remaining power of the rechargeable battery is decreased to the preset power; $OCV_0$ is the preset open circuit voltage; $TV_1$ is the shutdown voltage calculated based on $R_{T0}$, I and $OCV_0$; $TV_2$ is the shutdown voltage calculated based on $R_{cycle0}$, I and $OCV_0$; TV is the final shutdown voltage determined. $R_{T0}$ may be calculated using formula (1), and $R_{cycle0}$ may be calculated using formula (4).

At step 104, when the operating voltage of the rechargeable battery is decreased to the shutdown voltage, the terminal is controlled to shut down.

After determining the shutdown voltage matching the current usage state of the rechargeable battery based on the current usage state of the rechargeable battery, the terminal controls the terminal to shut down after detecting that the operating voltage of the rechargeable battery is decreased to the shutdown voltage.

In some embodiments, taking batteries having a capacity of 3940 mAh as an example, when discharged to 3.4V at −10° C., the discharge capacity of a new battery is 46%, and the discharge capacity of an aging battery after recycling is 31%. Compared with the new battery, the discharge capacity of the aging battery is reduced by 15%. Therefore, when the battery is aging, the shutdown voltage is adjusted to greatly increase the usable capacity of the battery.

Taking a new battery having a capacity of 3900 mAh as an example, the discharge capacity of the new battery is 54% when discharged to 3.4V at −10° C., and the discharge capacity of the new battery is 95% when discharged to 3.0V at −10° C. During the discharge of the battery from 3.4V to 3.0V, nearly 40% of electric quantity is more discharged. Therefore, when the temperature is low, the shutdown voltage is adjusted to greatly increase the usable capacity of the battery.

Based on the above analysis, when the battery is aging or at low temperature, the terminal is shut down with a fixed shutdown voltage, the remaining power of the rechargeable battery is large, and the rechargeable battery is not sufficiently discharged.

Therefore, it is very necessary to use the method according to some embodiments of the present disclosure to dynamically adjust the shutdown voltage of the rechargeable battery based on the current use state of the rechargeable battery, so that the rechargeable battery is sufficiently discharged when the terminal is shut down.

In some embodiments of the present disclosure, the terminal determines the first impedance based on the current temperature of the rechargeable battery, determines the second impedance based on the current number of charge times of the rechargeable battery, and determines the target impedance with a larger impedance value from the first impedance and the second impedance. Based on the preset open circuit voltage of the rechargeable battery, the target impedance, and the current operating current of the rechargeable battery, a shutdown voltage that matches the current usage state of the rechargeable battery is determined, and the shutdown voltage is used to control the terminal to shut down. When the impedance of the rechargeable battery increases, the shutdown method according to some embodiments of the present disclosure is applied to increase the available capacity of the rechargeable battery, improve the discharge performance of the rechargeable battery, thus the service time of the rechargeable battery is increased after a single charge, and the use experience is improved.

For clarity, the foregoing method embodiments are all expressed as a series of action combinations, but those skilled in the art should know that the present disclosure is not limited by the sequence of actions described, because according to the present disclosure, some steps may be performed in other orders or simultaneously.

Secondly, those skilled in the art should also know that some embodiments described in the specification are all optional embodiments, and the involved actions and modules are not necessarily required by the present disclosure.

Corresponding to the foregoing embodiment of the application function implementation method, the present disclosure also provides some embodiments of an application function implementation apparatus and a corresponding terminal.

Figure 4:
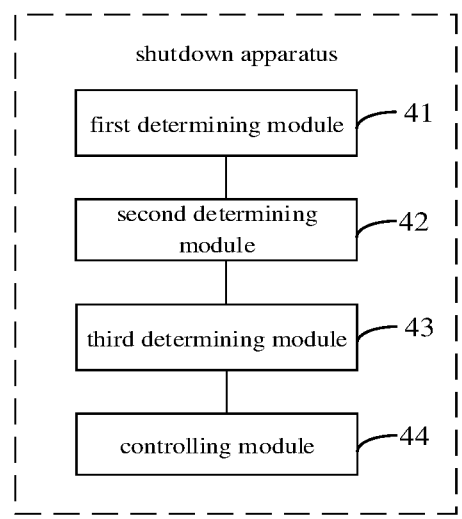
FIG. 4 is a block diagram of a shutdown apparatus according to some embodiments.

FIG. 4 is a block diagram of a shutdown apparatus according to some embodiments. The apparatus is applicable for a terminal, and the terminal is provided with a rechargeable battery. The apparatus includes: a first determining module 41, a second determining module 42, a third determining module 43, and a controlling module 44.

The first determining module 41 is configured to determine a first impedance and a second impedance of the rechargeable battery, in which the first impedance is an impedance determined based on a current temperature of the rechargeable battery, and the second impedance is an impedance determined based on a current number of charge times of the rechargeable battery.

The second determining module 42 is configured to determine a target impedance as a larger impedance value from the first impedance and the second impedance.

The third determining module 43 is configured to determine a shutdown voltage of the terminal based on a preset open circuit voltage of the rechargeable battery, the target impedance and a current operating current of a charging circuit.

The controlling module 44 is configured to control the terminal to shut down, when an operating voltage of the rechargeable battery is decreased to the shutdown voltage.

In some embodiments, based on the shutdown apparatus shown in FIG. 2, the first determining module 41 may include: a first obtaining submodule, a second obtaining submodule, and a first determining submodule.

The first obtaining submodule is configured to obtain a current impedance of the rechargeable battery, in which the current impedance is an impedance determined according to a current operating parameter of the rechargeable battery;

The second obtaining submodule is configured to obtain the current temperature change ratio of the rechargeable battery.

The first determining submodule is configured to determine the first impedance according to the current impedance, the current temperature change ratio and a preset first matching coefficient, in which the first matching coefficient is a matching coefficient between the current impedance and a currently measured impedance of the rechargeable battery.

In some embodiments, the first determining submodule is configured to obtain the first impedance based on a product of the current impedance, the current temperature change ratio and the first matching coefficient.

In some embodiments, the second determining submodule includes: an obtaining unit, a first obtaining unit, and a second obtaining unit.

The obtaining unit is configured to obtain the current temperature of the rechargeable battery.

The first obtaining unit is configured to obtain a temperature difference by subtracting a preset standard temperature from the current temperature.

The second obtaining unit is configured to obtain the current temperature change ratio by dividing the temperature difference by the standard temperature.

In some embodiments, the apparatus further includes: a first obtaining module, a second obtaining module, and a fourth determining module.

The first obtaining module is configured to obtain an initial impedance and an initially measured impedance of the rechargeable battery, in which the initial impedance is an impedance determined according to an initial operating parameter of the rechargeable battery.

The second obtaining module is configured to obtain an initial temperature change ratio of the rechargeable battery.

The fourth determining module is configured to determine the first matching coefficient according to the initially measured impedance, the initial impedance, and the initial temperature change ratio.

In some embodiments, the fourth determining module includes a first dividing submodule, and a second dividing submodule.

The first dividing submodule is configured to obtain a first ratio by dividing the initially measured impedance by the initial impedance.

The second dividing submodule is configured to obtain the first matching coefficient by dividing the first ratio by the initial temperature change ratio.

In some embodiments, based on the shutdown apparatus shown in FIG. 2, the first determining module may include: a third obtaining submodule, a fourth obtaining submodule, and a second determining submodule.

The third obtaining submodule is configured to obtain a current impedance of the rechargeable battery, in which the current impedance is an impedance determined according to a current operating parameter of the rechargeable battery.

The fourth obtaining submodule is configured to obtain the current number of charge times of the rechargeable battery.

The second determining submodule is configured to determine the second impedance according to the current impedance, the current number of charge times and a preset second matching coefficient, in which the second matching coefficient is a matching coefficient between the current impedance and a currently measured impedance of the rechargeable battery.

In some embodiments, the second determining submodule is configured to obtain the second impedance based on a product of the current impedance, the current number of charge times and the second matching coefficient.

In some embodiments, the apparatus further includes: a third obtaining module, a fourth obtaining module, and a fifth determining module.

The third obtaining module is configured to obtain an initial impedance and an initially measured impedance of the rechargeable battery, in which the initial impedance is an impedance determined according to an initial operating parameter of the rechargeable battery.

The fourth obtaining module is configured to obtain an initial number of charge times of the rechargeable battery.

The fifth determining module is configured to determine the second matching coefficient according to the initially measured impedance, the initial impedance, and the initial number of charge times.

In some embodiments, the fifth determining module further includes: a third dividing submodule, and a fourth dividing submodule.

The third dividing submodule is configured to obtain a second ratio by dividing the initially measured impedance by the initial impedance.

The fourth dividing submodule is configured to obtain the second matching coefficient by dividing the second ratio by the initial number of charge times.

In some embodiments, based on the shutdown apparatus shown in FIG. 2, the third determining module 43 may include: a multiplying submodule and a subtracting submodule.

The multiplying submodule is configured to obtain a target voltage based on a product of the target impedance and the current operating current.

The subtracting submodule is configured to obtain the shutdown voltage by subtracting the target voltage from the preset open circuit voltage.

In some embodiments, based on the shutdown apparatus shown in FIG. 2, the first determining module 41 is configured to determine the first impedance and the second impedance in response to detecting that a current remaining power of the rechargeable battery is decreased to a power threshold.

Basically, the device embodiment corresponds to the method embodiment, and relevant portions may be referred to the description of the method embodiment. The device embodiments described above are only exemplary, wherein the units described as separate components may or may not be physically separated, and the components displayed as units may or may not be physical units, that is, may be located in a place, or distributed to multiple network units. Part or all of the modules may be selected according to actual needs to achieve the objective of the disclosed solution. Those of ordinary skill in the art should understand and implement the solution without inventive works.

Correspondingly, in another aspect, some embodiments of the present disclosure provide a terminal.

Figure 6:
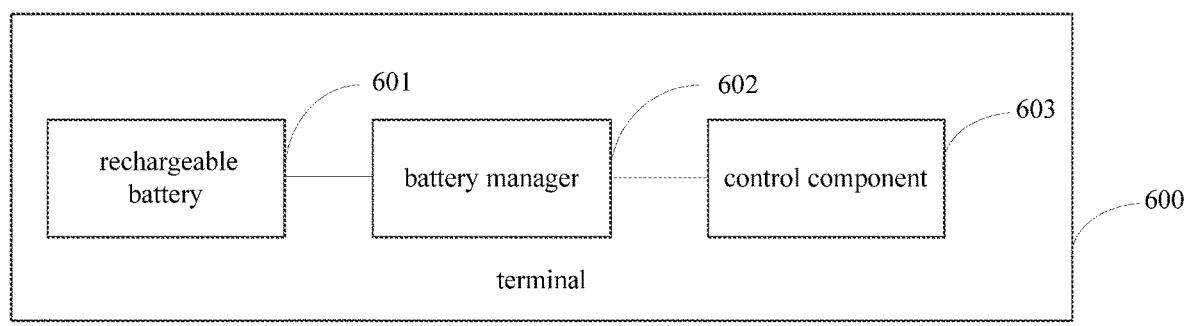
FIG. 6 is a block diagram of a terminal according to some embodiments.

FIG. 6 is a block diagram of a terminal 600 according to some embodiments. As illustrated in FIG. 6, the terminal 601 includes a rechargeable battery 601, a battery manager 602, and a control component 603.

The rechargeable battery 601 is provided in the terminal 600.

The battery manager 602 is configured to monitor parameters of the rechargeable battery 601, wherein the parameters of the rechargeable battery 601 includes a temperature of the rechargeable battery 601, a number of charge times of the rechargeable battery 601, and an operating current of the rechargeable battery 601.

The control component 603 is configured to communicate with the battery manager 602, and is configured to:

determine a first impedance and a second impedance of the rechargeable battery 601, wherein the first impedance is an impedance determined based on a current temperature of the rechargeable battery 601, and the second impedance is an impedance determined based on a current number of charge times of the rechargeable battery 601;

determine a target impedance as a larger impedance value from the first impedance and the second impedance;

determine a shutdown voltage of the terminal 600 based on a preset open circuit voltage of the rechargeable battery 601, the target impedance and a current operating current of the rechargeable battery 601; and control the terminal 600 to shut down, when an operating voltage of the rechargeable battery 601 is decreased to the shutdown voltage.

In some embodiments, the control component 603 is further configured to:

obtain a current impedance of the rechargeable battery 601, wherein the current impedance is an impedance determined according to a current operating parameter of the rechargeable battery 601;

obtain a current temperature change ratio of the rechargeable battery 601; and determine the first impedance according to the current impedance, the current temperature change ratio and a preset first matching coefficient, wherein the first matching coefficient is a matching coefficient between the current impedance and a currently measured impedance of the rechargeable battery 601.

In some embodiments, the control component 603 is further configured to obtain the first impedance based on a product of the current impedance, the current temperature change ratio and the first matching coefficient.

In some embodiments, the control component 603 is further configured to:

obtain the current temperature of the rechargeable battery 601;

obtain a temperature difference by subtracting a preset standard temperature from the current temperature; and obtain the current temperature change ratio by dividing the temperature difference by the standard temperature.

In some embodiments, the control component 603 is further configured to:

obtain an initial impedance and an initially measured impedance of the rechargeable battery 601, wherein the initial impedance is an impedance determined according to an initial operating parameter of the rechargeable battery 601;

obtain an initial temperature change ratio of the rechargeable battery 601; and determine the first matching coefficient according to the initially measured impedance, the initial impedance, and the initial temperature change ratio.

In some embodiments, the control component 603 is further configured to obtain a first ratio by dividing the initially measured impedance by the initial impedance; and obtain the first matching coefficient by dividing the first ratio by the initial temperature change ratio.

In some embodiments, the control component 603 is further configured to:

obtain a current impedance of the rechargeable battery 601, wherein the current impedance is an impedance determined according to a current operating parameter of the rechargeable battery 601;

obtain the current number of charge times of the rechargeable battery 601; and determine the second impedance according to the current impedance, the current number of charge times and a preset second matching coefficient, wherein the second matching coefficient is a matching coefficient between the current impedance and a currently measured impedance of the rechargeable battery 601.

In some embodiments, the control component 603 is further configured to obtain the second impedance based on a product of the current impedance, the current number of charge times and the second matching coefficient.

In some embodiments, the control component 603 is further configured to obtain an initial impedance and an initially measured impedance of the rechargeable battery 601, wherein the initial impedance is an impedance determined according to an initial operating parameter of the rechargeable battery 601; obtain an initial number of charge times of the rechargeable battery 601; and determine the second matching coefficient according to the initially measured impedance, the initial impedance, and the initial number of charge times.

In some embodiments, the control component 603 is further configured to obtain a second ratio by dividing the initially measured impedance by the initial impedance; and obtain the second matching coefficient by dividing the second ratio by the initial number of charge times.

In some embodiments, the control component 603 is further configured to:

obtain a target voltage based on a product of the target impedance and the current operating current; and obtain the shutdown voltage by subtracting the target voltage from the preset open circuit voltage.

In some embodiments, the control component 603 is further configured to determine the first impedance and the second impedance in response to detecting that a current remaining power of the rechargeable battery 601 is decreased to a power threshold.

Correspondingly, in another aspect, some embodiments of the present disclosure provide a terminal. The terminal included a processor, and a memory. The memory is configured to store instructions executable by the processor, in which the processor is configured to:

determine a first impedance and a second impedance of a rechargeable battery, in which the first impedance is an impedance determined based on a current temperature of the rechargeable battery, and the second impedance is an impedance determined based on a current number of charge times of the rechargeable battery;

determine a target impedance as a larger impedance value from the first impedance and the second impedance;

determine a shutdown voltage of the terminal based on a preset open circuit voltage of the rechargeable battery, the target impedance and a current operating current of a charging circuit; and control the terminal to shut down, when an operating voltage of the rechargeable battery is decreased to the shutdown voltage.

Figure 5:
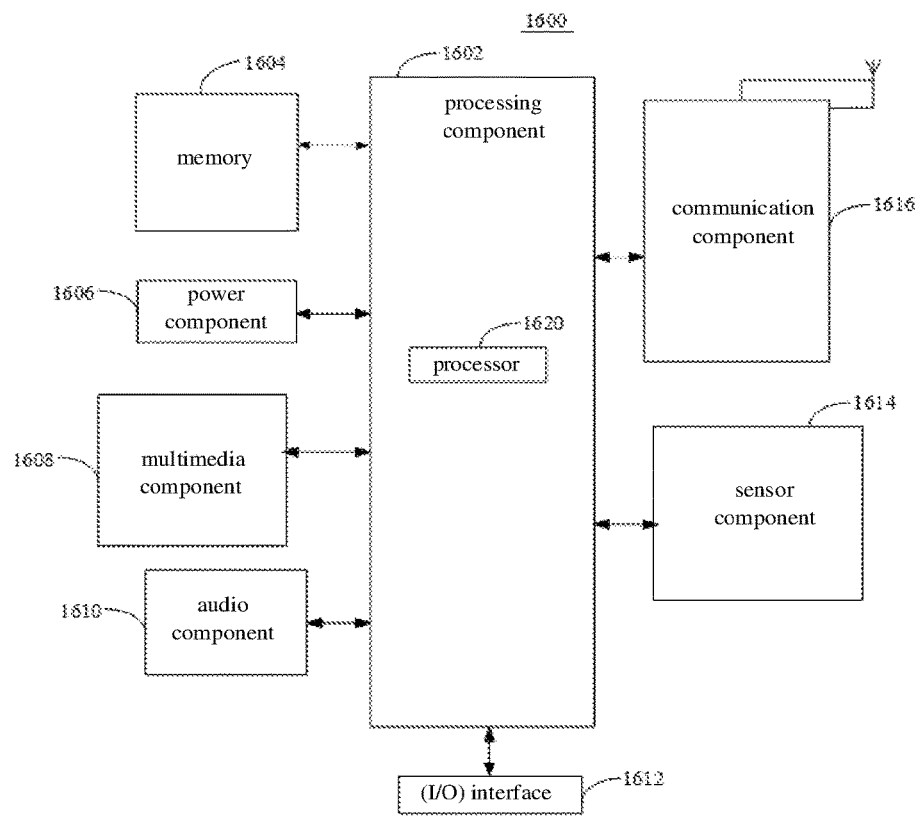
FIG. 5 is a schematic diagram of a terminal according to some embodiments.

FIG. 5 is a schematic diagram of a terminal 1600 according to some embodiments. For example, the apparatus 1600 may be a user equipment, which may be specifically a mobile phone, a computer, a digital broadcasting terminal, a messaging device, a game console, a tablet device, a medical device, a fitness device, a personal digital assistant, or a wearable device such as a smart watch, smart glasses, smart bracelets, and smart running shoes.

As illustrated in FIG. 5, the apparatus 1600 may include one or more of the following components: a processing component 1602, a memory 1604, a power component 1606, a multimedia component 1608, an audio component 1610, an input/output (I/O) interface 1612, a sensor component 1614, and a communication component 1616.

The processing component 1602 typically controls overall operations of the apparatus 1600, such as the operations associated with display, telephone calls, data communications, camera operations, and recording operations. The processing component 1602 may include one or more processors 1620 to execute instructions to perform all or part of the steps in the above described methods. Moreover, the processing component 1602 may include one or more modules which facilitate the interaction between the processing component 1602 and other components. For instance, the processing component 1602 may include a multimedia module to facilitate the interaction between the multimedia component 1608 and the processing component 1602.

The memory 1604 is configured to store various types of data to support the operation of the apparatus 1600. Examples of such data include instructions for any applications or methods operated on the apparatus 1600, contact data, phonebook data, messages, pictures, video, etc. The memory 1604 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 1606 provides power to various components of the apparatus 1600. The power component 1606 may include a power management system, one or more power sources, and any other components associated with the generation, management, and distribution of power in the apparatus 1600.

The multimedia component 1608 includes a screen providing an output interface between the apparatus 1600 and the user. In some embodiments, the screen may include a liquid crystal display (LCD) and a touch panel (TP). In some embodiments, organic light-emitting diode (OLED) displays can be employed.

If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action. In some embodiments, the multimedia component 1608 includes a front camera and/or a rear camera. When the apparatus 1600 is in an operation mode, such as a shooting mode or a video mode, the front camera and/or the rear camera may receive external multimedia data. Each front camera and rear camera can be a fixed optical lens system or have focal length and optical zoom capabilities.

The audio component 1610 is configured to output and/or input audio signals. For example, the audio component 1610 includes a microphone ("MIC") configured to receive an external audio signal when the apparatus 1600 is in an operation mode, such as a call mode, a recording mode, and a voice recognition mode. The received audio signal may be further stored in the memory 1604 or transmitted via the communication component 1616. In some embodiments, the audio component 1610 further includes a speaker to output audio signals.

The I/O interface 1612 provides an interface between the processing component 1602 and peripheral interface modules, such as a keyboard, a click wheel, buttons, and the like.

The buttons may include, but are not limited to, a home button, a volume button, a starting button, and a locking button.

The sensor component 1614 includes one or more sensors to provide status assessments of various aspects of the apparatus 1600. For instance, the sensor component 1614 may detect an open/closed status of the apparatus 1600, relative positioning of components, e.g., the display and the keypad, of the apparatus 1600, a change in position of the apparatus 1600 or a component of the apparatus 1600, a presence or absence of user contact with the apparatus 1600, an orientation or an acceleration/deceleration of the apparatus 1600, and a change in temperature of the apparatus 1600. The sensor component 1614 may include a proximity sensor configured to detect the presence of nearby objects without any physical contact. The sensor component 1614 may also include a light sensor, such as a CMOS or CCD image sensor, for use in imaging applications. In some embodiments, the sensor component 1614 may further include an acceleration sensor, a gyro sensor, a magnetic sensor, a pressure sensor, or a temperature sensor.

The communication component 1616 is configured to facilitate communication, wired or wirelessly, between the apparatus 1600 and other devices. The apparatus 1600 can access a wireless network based on a communication standard, such as Wi-Fi, 2G, 3G, 4G, or 5G, or a combination thereof. In one exemplary embodiment, the communication component 1616 receives a broadcast signal or broadcast associated information from an external broadcast management system via a broadcast channel. In one exemplary embodiment, the communication component 1616 further includes a near field communication (NFC) module to facilitate short-range communications. For example, the NFC module may be implemented based on a radio frequency identity (RFID) technology, an infrared data association (IrDA) technology, an ultra-wideband (UWB) technology, a Bluetooth (BT) technology, and other technologies.

In exemplary embodiments, the apparatus 1600 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components, for performing the above described methods.

In exemplary embodiments, there is also provided a non-transitory computer readable storage medium including instructions, such as included in the memory 1604, executable by the processor 1620 in the apparatus 1600, for performing the above-described methods. The method includes: determining a first impedance and a second impedance of a rechargeable battery, wherein the first impedance is an impedance determined based on the current temperature of the rechargeable battery, and the second impedance is an impedance determined based on a current number of charge times of the rechargeable battery; determining a target impedance with a larger impedance value from the first impedance and the second impedance; determining a shutdown voltage of a terminal based on a preset open circuit voltage of the rechargeable battery, the target impedance and a current operating current of a charging circuit; and controlling the terminal to shut down, when an operating voltage of the rechargeable battery is decreased to the shutdown voltage.

The non-transitory computer-readable storage medium may be ROM, random access memory (RAM), CD-ROM, magnetic tape, floppy disk, optical data storage device, or the like.

The various circuits, device components, units, blocks, or portions may have modular configurations, or are composed of discrete components, but nonetheless can be referred to as "units," "modules," or "portions" in general. In other words, the "circuits," "components," "modules," "blocks," "portions," or "units" referred to herein may or may not be in modular forms, and these phrases may be interchangeably used.

It will be understood that the "plurality" in the disclosure means two or more, and other quantifiers are similar. "And/or" describes the relationship of the related objects, indicating that there may be three relationships, for example, A and/or B may indicate three cases: A exists alone, A and B exist simultaneously, and B exists alone. The character "/" generally indicates that the relationship between the contextually relevant objects is a "or" relationship. The singular forms "a," "an," and "the" are also intended to include the plural forms unless the context clearly indicates otherwise.

It will be further understood that although the operations in the embodiments of the present disclosure are described in a specific order in the drawings, it will not be understood as requiring that the operations are performed in the specific order shown or in a serial order, or that perform all the operations shown to acquire the desired result. In certain environments, multitasking and parallel processing may be advantageous.

Those of ordinary skill in the art will understand that the above described modules/units can each be implemented by hardware, or software, or a combination of hardware and software. Those of ordinary skill in the art will also understand that multiple ones of the above described modules/units may be combined as one module/unit, and each of the above described modules/units may be further divided into a plurality of sub-modules/sub-units.

It is to be understood that the terms "lower," "upper," "center," "longitudinal," "transverse," "length," "width," "thickness," "upper," "lower," "front," "back," "left," "right," "vertical," "horizontal," "top," "bottom," "inside," "outside," "clockwise," "counter clockwise," "axial," "radial," "circumferential," "column," "row," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the present disclosure, a first element being "on," "over," or "below" a second element may indicate direct contact between the first and second elements, without contact, or indirect through an intermediate medium, unless otherwise explicitly stated and defined.

Moreover, a first element being "above," "over," or "at an upper surface of" a second element may indicate that the first element is directly above the second element, or merely that the first element is at a level higher than the second element. The first element "below," "underneath," or "at a lower surface of" the second element may indicate that the first element is directly below the second element, or merely that the first element is at a level lower than the second feature. The first and second elements may or may not be in contact with each other.

In the description of the present disclosure, the terms "one embodiment," "some embodiments," "example," "specific example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

In some embodiments, the control and/or interface software or app can be provided in a form of a non-transitory computer-readable storage medium having instructions stored thereon is further provided. For example, the non-transitory computer-readable storage medium may be a Read-Only Memory (ROM), a Random-Access Memory (RAM), a Compact Disc Read-Only Memory (CD-ROM), a magnetic tape, a floppy disk, optical data storage equipment, a flash drive such as a USB drive or an SD card, and the like.

Implementations of the subject matter and the operations described in this disclosure can be implemented in digital electronic circuitry, or in computer software, firmware, or hardware, including the structures disclosed herein and their structural equivalents, or in combinations of one or more of them. Implementations of the subject matter described in this disclosure can be implemented as one or more computer programs, i.e., one or more modules of computer program instructions, encoded on one or more computer storage medium for execution by, or to control the operation of, data processing apparatus.

Alternatively, or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them.

Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, drives, or other storage devices). Accordingly, the computer storage medium may be tangible.

The operations described in this disclosure can be implemented as operations performed by a data processing apparatus on data stored on one or more computer-readable storage devices or received from other sources.

The devices in this disclosure can include special purpose logic circuitry, e.g., an FPGA (field-programmable gate array), or an ASIC (application-specific integrated circuit). The device can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The devices and execution environment can realize various different computing model infrastructures, such as web services, distributed computing, and grid computing infrastructures. For example, the devices can be controlled remotely through the Internet, on a smart phone, a tablet computer or other types of computers, with a web-based graphic user interface (GUI).

A computer program (also known as a program, software, software application, app, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a mark-up language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this disclosure can be performed by one or more programmable processors executing one or more computer programs to perform actions by operating on input data and generating output. The processes and logic flows can also be performed by, and apparatus can also be implemented as, special purpose logic circuitry, e.g., an FPGA, or an ASIC.

Processors or processing circuits suitable for the execution of a computer program include, by way of example, both general and special purpose microprocessors, and any one or more processors of any kind of digital computer. Generally, a processor will receive instructions and data from a read-only memory, or a random-access memory, or both. Elements of a computer can include a processor configured to perform actions in accordance with instructions and one or more memory devices for storing instructions and data.

Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented with a computer and/or a display device, e.g., a VR/AR device, a head-mount display (HMD) device, a head-up display (HUD) device, smart eyewear (e.g., glasses), a CRT (cathode-ray tube), LCD (liquid-crystal display), OLED (organic light emitting diode) display, other flexible configuration, or any other monitor for displaying information to the user and a keyboard, a pointing device, e.g., a mouse, trackball, etc., or a touch screen, touch pad, etc., by which the user can provide input to the computer.

Other types of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In an example, a user can speak commands to the audio processing device, to perform various operations.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombinations.

Moreover, although features may be described above as acting in certain combinations and even initially claimed as such, one or more features from a claimed combination can in some cases be excised from the combination, and the claimed combination may be directed to a subcombination or variations of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

What is claimed is:

1. A shutdown method, applicable to a terminal, wherein the terminal is provided with a rechargeable battery, and the method comprises:
    determining a first impedance and a second impedance of the rechargeable battery, wherein the first impedance is an impedance determined based on a current temperature of the rechargeable battery, and the second impedance is an impedance determined based on a current number of charge times of the rechargeable battery;
    determining a target impedance as a larger impedance value from the first impedance and the second impedance;
    determining a shutdown voltage of the terminal based on a preset open circuit voltage of the rechargeable battery, the target impedance and a current operating current of a charging circuit; and
    controlling the terminal to shut down, when an operating voltage of the rechargeable battery is decreased to the shutdown voltage.

2. The method according to claim 1, wherein the determining the first impedance of the rechargeable battery comprises:
    obtaining a current impedance of the rechargeable battery, wherein the current impedance is an impedance determined according to a current operating parameter of the rechargeable battery;
    obtaining a current temperature change ratio of the rechargeable battery; and
    determining the first impedance according to the current impedance, the current temperature change ratio and a preset first matching coefficient, wherein the first matching coefficient is a matching coefficient between the current impedance and a currently measured impedance of the rechargeable battery.

3. The method according to claim 2, wherein the determining the first impedance according to the current impedance, the current temperature change ratio, and the preset first matching coefficient comprises:
obtaining the first impedance based on a product of the current impedance, the current temperature change ratio and the first matching coefficient.

4. The method according to claim 2, wherein the obtaining the current temperature change ratio of the rechargeable battery comprises:
obtaining the current temperature of the rechargeable battery;
obtaining a temperature difference by subtracting a preset standard temperature from the current temperature; and
obtaining the current temperature change ratio by dividing the temperature difference by the standard temperature.

5. The method according to claim 2, further comprising:
obtaining an initial impedance and an initially measured impedance of the rechargeable battery, wherein the initial impedance is an impedance determined according to an initial operating parameter of the rechargeable battery;
obtaining an initial temperature change ratio of the rechargeable battery; and
determining the first matching coefficient according to the initially measured impedance, the initial impedance, and the initial temperature change ratio.

6. The method according to claim 5, wherein the determining the first matching coefficient according to the initially measured impedance, the initial impedance, and the initial temperature change ratio comprises:
obtaining a first ratio by dividing the initially measured impedance by the initial impedance; and
obtaining the first matching coefficient by dividing the first ratio by the initial temperature change ratio.

7. The method according to claim 1, wherein the determining the second impedance of the rechargeable battery comprises:
obtaining a current impedance of the rechargeable battery, wherein the current impedance is an impedance determined according to a current operating parameter of the rechargeable battery;
obtaining the current number of charge times of the rechargeable battery; and
determining the second impedance according to the current impedance, the current number of charge times and a preset second matching coefficient, wherein the second matching coefficient is a matching coefficient between the current impedance and a currently measured impedance of the rechargeable battery.

8. The method according to claim 7, wherein the determining the second impedance according to the current impedance, the current number of charge times, and the preset second matching coefficient comprises:
obtaining the second impedance based on a product of the current impedance, the current number of charge times and the second matching coefficient.

9. The method according to claim 7, further comprising:
obtaining an initial impedance and an initially measured impedance of the rechargeable battery, wherein the initial impedance is an impedance determined according to an initial operating parameter of the rechargeable battery;
obtaining an initial number of charge times of the rechargeable battery; and
determining the second matching coefficient according to the initially measured impedance, the initial impedance, and the initial number of charge times.

10. The method according to claim 9, wherein the determining the second matching coefficient according to the initially measured impedance, the initial impedance, and the initial number of charge times comprises:
obtaining a second ratio by dividing the initially measured impedance by the initial impedance; and
obtaining the second matching coefficient by dividing the second ratio by the initial number of charge times.

11. The method according to claim 1, wherein the determining the shutdown voltage of the terminal based on the preset open circuit voltage of the rechargeable battery, the target impedance and the current operating current of the charging circuit, comprises:
obtaining a target voltage based on a product of the target impedance and the current operating current; and
obtaining the shutdown voltage by subtracting the target voltage from the preset open circuit voltage.

12. The method according to claim 1, wherein the determining the first impedance and the second impedance of the rechargeable battery comprises:
determining the first impedance and the second impedance in response to detecting that a current remaining power of the rechargeable battery is decreased to a power threshold.

13. A terminal, comprising:
a rechargeable battery;
a battery manager, configured to monitor parameters of the rechargeable battery, wherein the parameters of the rechargeable battery includes a temperature of the rechargeable battery, a number of charge times of the rechargeable battery, and an operating current of the rechargeable battery; and
a control component configured to communicate with the battery manager;
wherein the control component is configured to:
determine a first impedance and a second impedance of the rechargeable battery, wherein the first impedance is an impedance determined based on a current temperature of the rechargeable battery, and the second impedance is an impedance determined based on a current number of charge times of the rechargeable battery;
determine a target impedance as a larger impedance value from the first impedance and the second impedance;
determine a shutdown voltage of the terminal based on a preset open circuit voltage of the rechargeable battery, the target impedance and a current operating current of a charging circuit; and
control the terminal to shut down, when an operating voltage of the rechargeable battery is decreased to the shutdown voltage.

14. The terminal according to claim 13, wherein the control component is further configured to:
obtain a current impedance of the rechargeable battery, wherein the current impedance is an impedance determined according to a current operating parameter of the rechargeable battery;
obtain a current temperature change ratio of the rechargeable battery; and
determine the first impedance according to the current impedance, the current temperature change ratio and a preset first matching coefficient, wherein the first matching coefficient is a matching coefficient between the current impedance and a currently measured impedance of the rechargeable battery.

15. The terminal according to claim 14, wherein the control component is further configured to:
 obtain the current temperature of the rechargeable battery;
 obtain a temperature difference by subtracting a preset standard temperature from the current temperature; and
 obtain the current temperature change ratio by dividing the temperature difference by the standard temperature.

16. The terminal according to claim 14, wherein the control component is further configured to:
 obtain an initial impedance and an initially measured impedance of the rechargeable battery, wherein the initial impedance is an impedance determined according to an initial operating parameter of the rechargeable battery;
 obtain an initial temperature change ratio of the rechargeable battery; and
 determine the first matching coefficient according to the initially measured impedance, the initial impedance, and the initial temperature change ratio.

17. The terminal according to claim 13, wherein the control component is further configured to:
 obtain a current impedance of the rechargeable battery, wherein the current impedance is an impedance determined according to a current operating parameter of the rechargeable battery;
 obtain the current number of charge times of the rechargeable battery;
 determine the second impedance according to the current impedance, the current number of charge times and a preset second matching coefficient, wherein the second matching coefficient is a matching coefficient between the current impedance and a currently measured impedance of the rechargeable battery;
 obtain an initial impedance and an initially measured impedance of the rechargeable battery, wherein the initial impedance is an impedance determined according to an initial operating parameter of the rechargeable battery;
 obtain an initial number of charge times of the rechargeable battery; and
 determine the second matching coefficient according to the initially measured impedance, the initial impedance, and the initial number of charge times.

18. The terminal according to claim 13, wherein the control component is further configured to:
 obtain a target voltage based on a product of the target impedance and the current operating current; and
 obtain the shutdown voltage by subtracting the target voltage from the preset open circuit voltage.

19. The terminal according to claim 13, wherein the control component is further configured to determine the first impedance and the second impedance in response to detecting that a current remaining power of the rechargeable battery is decreased to a power threshold.

20. A mobile terminal implementing the method according to claim 12, comprising the rechargeable battery, a display screen, and a processing circuit configured to, upon the rechargeable battery having an increase in impedance, implement operations of the method to increase available capacity of the rechargeable battery and improve discharge performance of the rechargeable battery, thereby increasing a service time of the rechargeable battery after a single charge; wherein the power threshold is about 15%.

* * * * *